(12) United States Patent
Haslette et al.

(10) Patent No.: US 10,804,898 B2
(45) Date of Patent: Oct. 13, 2020

(54) WOOD VENEER PRODUCT COMPRISING CONDUCTIVE TRACKING

(71) Applicants: MERENDA LTD., Manorhamilton, Leitrim (IE); Cork Institute of Technology, Cork (IE)

(72) Inventors: Ronan Haslette, Leitrim (IE); Paul McEvoy, Dublin (IE); Juan Francisco Martinez Sanchez, Cork (IE)

(73) Assignees: CORK INSTITUTE OF TECHNOLOGY, Bishoptown, Cork (IE); MERENDA LIMITED, Manorhamilton, Leitrim (IE)

( * ) Notice: Subject to any disclaimer, the term of this patent is extended or adjusted under 35 U.S.C. 154(b) by 10 days.

(21) Appl. No.: 16/068,437

(22) PCT Filed: Jan. 6, 2017

(86) PCT No.: PCT/GB2017/050025
§ 371 (c)(1),
(2) Date: Jul. 6, 2018

(87) PCT Pub. No.: WO2017/118860
PCT Pub. Date: Jul. 13, 2017

(65) Prior Publication Data
US 2019/0020339 A1 Jan. 17, 2019

(30) Foreign Application Priority Data

Jan. 6, 2016 (GB) .................................. 1600245.3

(51) Int. Cl.
*H03K 17/96* (2006.01)
*H03K 17/955* (2006.01)

(52) U.S. Cl.
CPC ......... *H03K 17/962* (2013.01); *H03K 17/955* (2013.01); *H03K 2017/9602* (2013.01); *H03K 2217/960755* (2013.01)

(58) Field of Classification Search
None
See application file for complete search history.

(56) References Cited

U.S. PATENT DOCUMENTS 6,180,211 B1 * 1/2001 Held .................. B32B 27/00
428/172
2005/0088416 A1 4/2005 Hollingsworth
(Continued)

FOREIGN PATENT DOCUMENTS

CN 103425359 A 12/2013
EP 1924000 A2 5/2008
(Continued)

OTHER PUBLICATIONS

Arakistain, I., et al., "Woodtouch, a New Interaction Interface for Wooden Furniture: Development of Touch Sensitve Interfaces for Natural Interaction with Wooden Furniture and Lighting Control," Submitted on Jul. 3, 2013, 6 pages.
(Continued)

*Primary Examiner* — Jas A Sanghera
(74) *Attorney, Agent, or Firm* — Withrow & Terranova, P.L.L.C.; Vincent K. Gustafson (57) ABSTRACT

A wood veneer product (1) comprises one or more layers of wood veneer (2). A backing layer (4), for example a cellulose-based backing layer, has a first outer surface bonded to the one or more layers of wod veneer (2). Electrically conductive tracking (8) is arranged on or against a second outer surface of the backing layer (4) opposite to the first outer surface.

19 Claims, 2 Drawing Sheets

(56) References Cited

U.S. PATENT DOCUMENTS

| | | | |
|---|---|---|---|
| 2006/0181154 A1 | 8/2006 | Ratner et al. | |
| 2007/0291016 A1* | 12/2007 | Philipp | G01D 5/2405 345/174 |
| 2008/0224758 A1 | 9/2008 | Klopfer | |
| 2008/0257706 A1 | 10/2008 | Haag | |
| 2009/0058118 A1* | 3/2009 | Hein | B60K 35/00 296/1.08 |
| 2009/0078167 A1 | 3/2009 | Ellegaard | |
| 2011/0311787 A1* | 12/2011 | Akesson | B32B 3/10 428/195.1 |
| 2012/0015176 A1 | 1/2012 | Riebel et al. | |
| 2012/0043914 A1 | 2/2012 | Mischel, Jr. et al. | |
| 2012/0314348 A1 | 12/2012 | Moncrieff | |
| 2013/0249568 A1 | 9/2013 | Botten | |
| 2014/0246300 A1* | 9/2014 | Wende | H03K 17/962 200/600 |
| 2015/0153867 A1 | 6/2015 | Koss et al. | |
| 2015/0375677 A1* | 12/2015 | Salter | B62D 1/06 362/510 |
| 2017/0345323 A1 | 11/2017 | Martinez Sanchez et al. | |

FOREIGN PATENT DOCUMENTS

| | | |
|---|---|---|
| EP | 2380458 A1 | 10/2011 |
| FR | 2779889 A1 | 12/1999 |
| WO | 2013063445 A2 | 5/2013 |

OTHER PUBLICATIONS

"Prodema® ProdEX: Composite Panels with Natural Wood Veneer," Informational and Instructional Packet, 2012, 43 pages.

Bang & Olufsen, "BeoSound Moment," Detailed Specifications sheet, Available online at: <<https://www.bang-olufsen.com/ContentV3/downloads/EN_19122014_productsheet_print.pdf>>, Dec. 19, 2014, 2 pages.

Search Report under Section 17(5) for United Kingdom Patent Application No. GB1600245.3, dated Jun. 29, 2016, 7 pages.

International Search Report and Written Opinion for International Patent Application No. PCT/GB2017/050025, dated Mar. 14, 2017, 10 pages.

Examination Report for European Patent Application No. 17700306.8, dated Aug. 3, 2020, 8 pages.

* cited by examiner

WOOD VENEER PRODUCT COMPRISING CONDUCTIVE TRACKING

This application is a 35 U.S.C. § 371 national phase filing of International Application No. PCT/GB2017/050025 filed on Jan. 6, 2017, and claims the benefit of United Kingdom Patent Application No. 1600245.3 filed on Jan. 6, 2016, wherein the disclosures of the foregoing applications are hereby incorporated by reference herein in their respective entireties.

The present invention relates to wood veneer products and methods of manufacturing a wood veneer product with touch sensing capability. In particular, the present invention relates to wood veneer products that have built-in touch sensing. The present invention also extends to electrical devices and furniture with a touch-sensitive wood veneer product attached to a surface thereof.

Natural wood veneers have been used for many years to provide a decorative surface finish to furniture and other products, which may not be formed of solid wood but wood composite e.g. MDF. The veneers are thinly sliced from a block of solid wood or a tree trunk to produce a layer that is less than 3 mm thick. Many commercially available veneers are typically 0.5 mm thick, but can be sanded down to a thickness of about 0.2 mm. Depending on the angle at which the wood is sliced (e.g. crown cut or rift cut), and the tree species, natural veneers can vary greatly in the appearance of the wood grain. Wood veneers can be available raw, without any backing, or backed with a paper or fleece backing material. A cellulose-based backing layer can provide stability, strength, flexibility and protection to the veneer. Occasionally some wood veneers have a phenolic backing, for example non-natural wood veneers.

It has been proposed, for example in US 2013/249568, to use wood veneer to conceal a capacitive sensor that is countersunk into the surface of a cabinet or piece of furniture to provide a touch control for electrical equipment connected to the sensor. An electrical device, such as lighting, stereos, computers and audio-visual equipment, may therefore be controlled by touching the externally-exposed surface of the veneer above the sensor. However this requires a cavity or recess to be fabricated by routing out a space to accommodate the sensor, including its circuit board and associated wiring. The veneer is supplied separately from the sensor and thus there is an onus on the cabinet manufacturer to ensure that the veneer has a suitable thickness, and any windows or patterns required to match the sensor, while the sensor is supplied without any knowledge of the covering veneer.

It would be desirable to be able to supply a manufacturer of furniture or electrical equipment with a wood veneer product that provides a built-in touch sensing capability.

According to a first aspect of the present invention there is provided a wood veneer product comprising: one or more layers of wood veneer; a backing layer having a first outer surface bonded to the one or more layers of wood veneer; and electrically conductive tracking arranged on or against a second outer surface of the backing layer opposite to the first outer surface. Preferably the backing layer is a cellulose-based backing layer.

Thus a wood veneer product according to the present invention provides a conventional wood veneer with the additional functionality of electrical sensing, embedded during manufacture of the wood veneer product and hidden beneath the wood veneer layer(s). A manufacturer of furniture or electrical equipment can simply apply the wood veneer product to an outer surface without needing to separately design and embed a sensing device. By providing the electrically conductive tracking below the wood veneer layer(s), the natural finish of the wood veneer can be enjoyed without modifying the surface and electrical connections can be hidden from view.

In preferred embodiments of the present invention, the electrically conductive tracking is arranged to provide capacitive touch sensing. Capacitance-based sensing is particularly beneficial as it allows for touch sensing to take place through the layers of wood veneer and backing that are typically not electrically conductive, and without needing manual pressure to be applied to the surface of the wood veneer product so that even light touches or brushing can be sensed. The electrically conductive tracking may be arranged to provide one or more of: mutual capacitance sensing; self-capacitance sensing; or surface capacitance sensing. For example, mutual capacitance sensing can allow for multi-gesture sensing. Mutual capacitance sensing typically comprises a grid-based approach with a voltage applied to the tracking and the capacitance measured at intersection points in the grid. A change in capacitance is measured when the dielectric above changes due to the presence of a finger touch. In another example, self-capacitance sensing may be employed for high accuracy detection of a single touch but not simultaneous touches or gestures. Of course a given wood veneer product may include one or more different regions of capacitive touch sensing so that a mixture of capacitance sensing techniques are employed.

The capacitive touch sensing may be required to provide a certain resolution depending on the type of performance required from the wood veneer product. For example, a single touch-sensitive switch with simple on/off functionality does not need to sense exactly where the switch is touched, whereas a touch-sensitive control panel or mouse would need high accuracy in touch detection. The resolution of the capacitive touch sensing may depend on the thickness of the one or more wood veneer layers. Preferably the capacitive touch sensing has a resolution of at least 40%, 50%, or 60%, and up to 70%, of the thickness of the one or more wood veneer layers. This means that a 0.5 mm thick veneer would provide a capacitive sensing resolution of around 100-200 dpi. In at least some embodiments, the wood veneer may be mechanically thinned (e.g. by sanding) during manufacture of the wood veneer product so as to improve resolution. Thus in some embodiments the wood veneer may have a thickness of 0.5 mm or less, 0.4 mm or less, 0.3 mm or less, or about 0.2 mm.

The electrically conductive tracking may be arranged on or against the second outer surface of the backing layer using any suitable technique. In some examples, the electrically conductive tracking may be pre-formed into a track pattern which is then attached to or against the second outer surface of the backing layer. In some other examples, the electrically conductive tracking may be deposited directly onto the second outer surface of the backing layer to form a track pattern in situ, for instance by sputtering, lithography or printing. In some other examples, the electrically conductive tracking may take the form of flexible cable that is laid down against the second outer surface of the backing layer.

In some embodiments, the backing layer may carry one or more input/output devices enabling the input of electrical power to the tracking and the output of electrical signals. For example, the backing layer may carry an IO port, such as a micro USB port, which is connected to the tracking. As will be described in more detail below, such an IO port may also be connected to one or more further electrical components where such components are also carried by the backing layer and therefore integrated into the wood veneer product. In other embodiments, the electrically conductive tracking may be arranged to extend to an outer edge of the backing layer, and hence to an outer surface of the wood veneer product. One or more input/output devices, e.g. enabling the input of electrical power to the tracking and/or the output of electrical signals from the tracking, may then be connected to the electrically conductive tracking. Such input/output devices may form part of the wood veneer product or be attached later, e.g. when installing the wood veneer product.

In various embodiments the wood veneer, or at least the lowermost layer of wood veneer facing the electrically conductive tracking, may comprise one or more recesses arranged to accommodate the tracking. Such recesses may be machined, for example by thinning or removing some of the wood veneer, so as to assist in locating the tracking. Such recesses may only be 0.1-0.2 mm deep.

In a first set of embodiments the electrically conductive tracking comprises one or more electrically conductive tracks on a printed circuit board. Accordingly the wood veneer product may comprise a printed circuit board (PCB) mounted to or against the second outer surface of the backing layer. An advantage of the PCB being mounted against the backing layer, rather than directly against a wood veneer, is that natural moisture from the wood can be absorbed by the backing layer so that it does not interfere with electrical performance. A PCB is a particularly a convenient way to provide the electrically conductive tracking along with its associated electrical connections. The PCB may comprise one or more layers, especially when it is desired to provide mutual capacitance sensing or self-capacitance sensing. For example, the PCB may be double-sided with the electrically conductive tracks printed on both sides but running in opposite directions to form a grid. Alternatively, for example, the PCB may comprise at least two layers with the electrically conductive tracks printed in opposite directions to form a grid.

In some embodiments the PCB may simply carry the electrically conductive tracks and electrical connections enabling the tracks to be connected to external components providing power and signal processing/control. In some embodiments the PCB may also comprise integrated electronics providing signal processing and/or control for the electrically conductive tracking.

In addition, in various ones of such embodiments, the PCB may preferably carry one or more further electrical components. In some embodiments the PCB may have a larger surface area than the one or more layers of wood veneer and the backing layer, e.g. such that the PCB extends laterally beyond these layers. The exposed surface of the PCB may be used to carry one or more further electrical components outside the layers. In some embodiments the PCB may carry one or more further electrical components below the layers, with such electrical components optionally inserted into corresponding recesses or depressions formed in the wood veneer layer(s). Such recesses may be formed by localised machining on the back of the veneer and may, for example, have a depth between 0.5 mm and 2 mm, depending on the thickness of the wood veneer. However it will be appreciated that such recesses are formed and filled during manufacture of the wood veneer product, which is then supplied in a ready state for touch sensing.

In a set of embodiments a microprocessor is carried on the PCB. The microprocessor may be connected to the one or more electrically conductive tracks in order to implement capacitive touch sensing. So as to minimise the thickness of the wood veneer product, the microprocessor may be ultra-thin, for example a thin-film microprocessor. The microprocessor may have a thickness of about 1 mm or less. The microprocessor may even be etched onto the PCB.

In addition, or alternatively, one or more piezoelectric actuators may be carried on the PCB. Such piezoelectric actuators may be connected to the same microprocessor as the one or more electrically conductive tracks. In some examples a piezoelectric actuator may be arranged to provide pressure-based touch sensing in addition to the capacitive touch sensing. For instance, such a piezoelectric actuator could be arranged to require a "hard" press to turn an electrical item on/off while the capacitive touch sensing could be controlled to accept the input of user commands once the electrical item has been turned on. In some examples a piezoelectric actuator may be arranged to provide haptic feedback. For instance, such a piezoelectric actuator could be controlled to vibrate in response to user input (e.g. to indicate a successful touch) and/or to vibrate in order to stimulate user input (e.g. to indicate where to touch).

In addition, or alternatively, one or more light emitters may be carried on the PCB. This can aid touch sensing operations in darkness. Such light emitters may be connected to the same microprocessor as the one or more electrically conductive tracks. In some examples the light emitters may be arranged to stimulate user input (e.g. to indicate where to touch) and/or to illuminate in response to user input (e.g. to indicate a successful touch). In order to reduce energy consumption and avoid overheating of the wood veneer product, the one or more light emitters may preferably comprise light emitting diodes (LEDs). It has been recognised that the one or more layers of wood veneer may be thin enough so as to be optically transmissive, at least for the intensity of light from LEDs. Preferably there are no openings or windows formed in the one or more layers of wood veneer. However, in at least some embodiments the one or more layers of wood veneer may be thinned (e.g. by sanding during manufacture of the wood veneer product) in a region above each light emitter so as to enhance illumination. For example, the product may comprise a 0.5 mm thick layer of wood veneer that is thinned to about 0.2 mm or even 0.1 mm in each region above a light emitter.

In addition, or alternatively, a wireless transceiver may be carried on the PCB. This can enable user touch inputs to be transmitted to a separate controller with a reduction in the electrical wiring needed for the veneer product.

It is preferable for the wood veneer product to be thin and flexible, like a standard wood veneer, so that it can be supplied in sheet or roll form and applied to a wide range of different surfaces, both flat and curved. In a preferred set of embodiments the PCB comprises a flexible plastic substrate, which may optionally be transparent. For example, the flexible plastic substrate may be formed of polyimide, PEEK or polyester. The flexible PCB may have a thickness of about 0.1 mm.

It is preferable for the various layers of the wood veneer product to be bonded together to form an integral product. Accordingly an adhesive may be present between each of the layers of wood veneer, between the (lower) layer of wood veneer and the backing layer, and between the backing layer and the printed circuit board (where one is provided). Different types of adhesive may be used between the different layers, e.g. a suitable hot melt adhesive may be chosen according to the bonding temperature and/or pressure required.

In a second set of embodiments the electrically conductive tracking comprises conductive ink printed on the second outer surface of the backing layer, or printed on the facing surface of a further backing layer (where provided, as outlined further below). Accordingly the thickness of the wood veneer product may be minimised by avoiding the need for a printed circuit board to carry the electrically conductive tracking. Printable conductive "inks" typically comprise silver, either pure silver or silver/silver chloride, or carbon. The conductive ink may be screen printed directly onto the receiving surface. The electrically conductive tracking may comprise conductive tracks printed in opposite directions to form a grid for the purposes of mutual capacitance sensing or self-capacitance sensing. In such embodiments the resolution of capacitive touch sensing may depend less on the thickness of the wood veneer and more on the size of any surface texture, e.g. the cellulose fibres forming the receiving surface for the conductive ink.

In some embodiments, electrical connections for the conductive tracking may be printed on the same surface or otherwise mounted to the surface. Such electrical connections may enable the printed tracks to be connected to one or more further electrical components of the type(s) discussed above. In this second set of embodiments such further electrical components may not be integrated with the wood veneer product but provided externally. For example, a manufacturer of electrical equipment may wish to be supplied with a wood veneer product that merely provides touch sensing capability and the ability to be connected to existing electronics in a particular device. Alternatively, in some embodiments, such further electrical components may also be printed on a surface of one of the backing layers or otherwise sandwiched therebetween.

There will now be described some general features that are applicable to any or all of the embodiments, and permutations of preferred features, already described hereinabove.

In a preferred set of embodiments the wood veneer product comprises a further backing layer facing the second outer surface of the above-mentioned backing layer such that the electrically conductive tracking is positioned therebetween. In any of the first or second sets of embodiments, such a further backing layer can provide a protective function for the electrically conductive tracking. Where the electrically conductive tracking comprises conductive ink, this may be printed on the surface of the further backing layer that is facing the second outer surface of the backing layer, or on the second outer surface of the backing layer, or on both surfaces.

Preferably the further backing layer is non-conductive and therefore prevents short circuiting. The further backing layer may form an outer surface of the wood veneer product, the other outer surface being that of wood veneer. Advantageously the further backing layer provides an outer surface that can be used to bond the wood veneer product to a desired substrate, such as a piece of furniture or an electrical item.

As will be discussed further below, the backing layer which has a first outer surface bonded to the one or more layers of wood veneer is preferably a cellulose-based backing layer. In some embodiments the further backing layer may also be cellulose-based. The further backing layer may be the same as the cellulose-based backing layer that is bonded to the one or more layers of wood veneer, but preferably the further backing layer is thicker. In some alternative embodiments the further backing layer may comprise any electrically insulative material e.g. plastic film.

Regardless of the material(s) chosen, the further backing layer may be bonded to the second outer surface of the backing layer using a suitable adhesive. As is mentioned above, the various layers of the wood veneer product are preferably bonded together to form an integral product. The material of the further backing layer may be chosen depending on a target substrate to which the wood veneer product is to be attached.

In some preferred embodiments the backing layer which has a first outer surface bonded to the one or more layers of wood veneer is preferably a cellulose-based backing layer. Such paper or fleece backing materials are in widespread use. The (preferably cellulose-based) backing layer which has a first outer surface bonded to the one or more layers of wood veneer has an important function in helping the natural wood of the veneer layer(s) to retain its moisture content while preventing the passage of moisture from the wood veneer to the electrically conductive tracking. By ensuring that the wood veneer does not dry out for longer, more 'life' is retained in the product. This also adds to the enduring flexibility of the product and its quality.

The (preferably cellulose-based) backing layer is also an important part of the product because the natural wood of the veneer layer(s) is very thin and susceptible to damage easily, especially if rolled up. Another function of the (preferably cellulose-based) backing layer is to assist in handling of the veneer layer(s) and further processing steps. Yet another function of the (preferably cellulose-based) backing layer is to provide the veneer layer(s) with stability, which can allow them e.g. to be sanded to micro thickness (~0.2 mm), slit to width accurately, and rolled up accurately.

In embodiments where a further backing layer, preferably a cellulose-based backing layer, forms an outer surface of the wood veneer product, this helps to increase the strength of the product so that it can be shaped and moulded, e.g. wrapped onto complex surfaces. The outer backing layer provides a membrane between the wood veneer product and a receiving substrate. This is beneficial as it can act as a buffer against tolerance deficiencies in the substrate. Furthermore, if the substrate has a high moisture content e.g. MDF then the outer backing layer can shield the electrically conductive tracking from ingress of moisture.

Any of the cellulose-based backing layers mentioned above may preferably consist of a nonwoven layer of fibres, including cellulose fibres and optionally other natural or synthetic polymer fibres. Commonly known as "backing fleece", such a nonwoven layer may mainly comprise long-fibre cellulose, optionally with synthetic fibres and latex binder admixed to increase the material's tear resistance and flexibility. Suitable backing fleece for veneer is commercially available from PWG VeneerBackings GmbH.

The backing layer, and optionally any further backing layer (where provided), may consist of one or more materials that are not cellulose-based. A backing layer that is not cellulose-based may be able to function in the same way to protect moisture levels, allow flexibility, and provide stability to the wood veneer layer(s). Suitable materials are preferably electrically insulative and further preferably available as thin sheets or films. In some embodiments the backing layer and/or the further backing layer is polymer-based. This includes natural polymers such as cellulose (e.g. from wood or cotton), silk, wool, and proteins, and synthetic polymers such as polyethylene or phenolic resins. In some embodiments the backing layer and/or the further backing layer may comprise a composite or laminate material. For example, the backing layer and/or the further backing layer may comprise a fibre-reinforced polymer. A suitable phenolic laminate may be made by impregnating one or more layers of cellulose fibres (such as paper or cotton) with phenolic polymer and laminating under heat and pressure. In some embodiments the backing layer and/or the further backing layer may comprise a resin-saturated paper backing layer.

In some embodiments the backing layer and/or the further backing layer is preferably formed from a biodegradable polymer (e.g. so-called biopolymers or bioplastics). A particularly suitable biopolymer is poly(lactic acid) or polylactide (PLA), a biodegradable and bioactive thermoplastic aliphatic polyester derived from renewable resources, such as corn starch, potato starch, tapioca starch or sugarcane. In some embodiments the backing layer and/or the further backing layer may comprise a biodegradable composite or laminate material. For example, the backing layer and/or the further backing layer may comprise a fibre-reinforced biopolymer. The reinforcing fibres may be cellulose-based, e.g. wood fibres.

The backing layer and/or the further backing layer (where provided) may be provided with a one-side glue coating ready for bonding to a veneer layer.

In any of the embodiments described above, the thickness of the backing layer, and optionally any further backing layer (where provided), may be chosen so as to provide sufficient strength and stability without unduly affecting the overall thickness of the wood veneer product. In various embodiments, any of the (preferably cellulose-based) backing layers mentioned above may preferably have a thickness of 0.1-0.2 mm, for example a thickness of about 130 µm (5.1 mil) for PWG Backing Fleece 30ST/30. In various embodiments, any of the (preferably cellulose-based) backing layers mentioned above may preferably have a thickness of 0.2 mm or less, preferably 0.15 mm or less. In various embodiments, any of the (preferably cellulose-based) backing layers mentioned above may preferably have a thickness of about 0.05 mm. Accordingly a preferred thickness range for the (preferably cellulose-based) backing layers is 0.05-0.2 mm or 0.05-0.15 mm. In various embodiments, any of the (preferably cellulose-based) backing layers mentioned above may preferably have a basis weight of 20-30 gsm.

The (preferably cellulose-based) backing layer having a first outer surface bonded to the one or more layers of wood veneer is preferably bonded to the veneer with adhesive, further preferably cured under temperature and pressure. The (preferably cellulose-based) backing layer may be impregnated with a suitable adhesive, which can facilitate sheet manufacture as all that is required is for heat and pressure to be applied to bond the backing layer to the veneer. Once bonded together, these layers can be rolled up, or transported as a preformed sheet, before the electrically conductive tracking is added to the second outer surface of the (preferably cellulose-based) backing layer in a separate manufacturing step. Alternatively, the wood veneer product may be manufactured in a single process. Regardless of how the final wood veneer product is manufactured, it may be supplied in sheet or roll form to a customer wishing to add a touch-sensitive wood surface to an item.

This is considered novel and inventive in its own right, and thus according to a second aspect of the present invention there is provided a method of manufacturing a wood veneer product with touch sensing capability, comprising:

bonding one or more layers of wood veneer to a first surface of a backing layer;

arranging electrically conductive tracking on or against a second outer surface of the backing layer opposite to the first outer surface; and attaching a further backing layer below the electrically conductive tracking to form a wood veneer product with touch sensing capability.

Preferably the backing layer is a cellulose-based backing layer.

It has not previously been proposed by a wood veneer manufacturer to make or supply an integrated product that combines the aesthetics of natural wood veneer with touch sensing capability. It will be recognised that the first manufacturing step may be the same process used to make standard wood veneers, and indeed this step may be performed by a different manufacturer and/or at a different time. In other words, the first manufacturing step may simply comprising providing a pre-formed standard veneer with backing (e.g. fleece backing). In order to form the final wood veneer product, the electrically conductive tracking is sandwiched between the (preferably cellulose-based e.g. fleece) backing layer and the further backing layer.

As is described above, the electrically conductive tracking is preferably arranged to provide capacitive touch sensing. As is mentioned above, the sensing resolution may depend on the thickness of the wood veneer layer(s). Accordingly the method may further comprise the step of mechanically thinning, for example sanding, the bonded layers of wood veneer and (preferably cellulose-based) backing before or after adding the electrically conductive tracking. This may improve the overall touch sensitivity of the wood veneer product. In addition, or alternatively, the method may comprise selectively thinning one or more regions of the wood veneer layer(s), for example to assist in local touch sensitivity (e.g. where high resolution sensing may be required) and/or optical transmission (e.g. above a light emitter). For example, one or more regions of the wood veneer layer(s) may be thinned to 0.1-0.2 mm, for instance where a light emitter e.g. LED is positioned below and/or to form a physical depression or mound that highlights button positions aligned with the electrically conductive tracking.

In a first set of embodiments, the method may comprise mounting a printed circuit board (PCB) carrying the electrically conductive tracking to or against the second outer surface of the (preferably cellulose-based) backing layer. Such a PCB may include any of the features described hereinabove. In a second set of embodiments, the method may comprise printing conductive ink on the second outer surface of the (preferably cellulose-based) backing layer and/or on the facing surface of the further backing layer. Such printing may include any of the features described hereinabove.

It will be appreciated that wood veneer products as described herein are advantageous as they can be applied directly to a substrate e.g. in the form of a piece of furniture or an electrical item. The manufacturing method may further comprise the step of applying an adhesive to an outer surface of the further backing layer. The wood veneer product may therefore be supplied with a glue coating so that it is ready to be adhered to a receiving substrate.

The present invention extends to a method of attaching a touch sensitive wood veneer product to form one or more of the following: a veneer key pad or track pad; a veneer light switch; a veneer control panel; a touch sensitive item of veneer furniture (e.g. a table, desk, lectern, etc.); a veneer cladding (e.g. for fitted rooms); a veneer component for a musical instrument; a veneer component for sports equipment (e.g. gym equipment, bats, cues, rackets, sticks, hurlies); a veneer toy or game; veneer flooring.

The present invention extends to an electrical device or a piece of furniture with a touch sensitive wood veneer product attached to a surface thereof.

Although the various wood veneer products described above in preferred embodiments include a cellulose-based backing layer bonded to the one or more layers of wood veneer, there may be embodiments where the (preferably cellulose-based) backing layer can be omitted, for example where the moisture content of the wood veneer does not need to be controlled. In such embodiments the electrically conductive tracking may be arranged directly on or against a lower surface of the wood veneer layer(s). This can reduce the number of manufacturing steps involved in making the wood veneer product.

This is considered novel and inventive in its own right, and thus when viewed from a further aspect the present invention provides a wood veneer product comprising: one or more layers of wood veneer; and electrically conductive tracking arranged on or against an outer surface of the one or more layers of wood veneer. Such a wood veneer product may then be supplied to a manufacturer of furniture or electrical equipment with a built-in touch sensing capability ready. In various embodiments of this further aspect of the invention, the electrically conductive tracking may include any of the features described above. For example, the electrically conductive tracking may comprise one or more electrically conductive tracks on a printed circuit board or conductive ink printed on the outer surface of the wood veneer layer(s).

In various embodiments of this further aspect of the invention, the wood veneer product preferably comprises a backing layer facing the outer surface of the one or more layers of wood veneer such that the electrically conductive tracking is positioned therebetween. This backing layer advantageously provides a protective function for the electrically conductive tracking. Where the electrically conductive tracking comprises conductive ink, this may alternatively or additionally be printed on the surface of the backing layer that is facing the outer surface of the one or more layers of wood veneer. Preferably the backing layer is non-conductive and therefore prevents short circuiting. In some embodiments the backing layer may be cellulose-based. In some alternative embodiments the backing layer may comprise any electrically insulative material e.g. plastic or phenolic film. In some alternative embodiments the backing layer may comprise a fibre-reinforced ploymer material such as cellulose fibres in phenolic resin. The backing layer beneficially provides the wood veneer product with strength, support, stability and improved handling. As is mentioned above, the various layers of the wood veneer product are preferably bonded together to form an integral product.

Although the various wood veneer products described above all include electrically conductive tracking to provide a touch sensing function, it is envisaged that a touch sensing capability may be implemented in a wood veneer product using alternative sensing means. For example, the electrically conductive tracking may possibly be replaced by one or more piezoelectric sensors. Alternatively, various touch sensing techniques employed in touchscreens could potentially be applied to a wood veneer product.

Thus when viewed from a further broad aspect the present invention provides a wood veneer product comprising: one or more layers of wood veneer; and touch sensing means arranged on or against an outer surface of the one or more layers of wood veneer. It has not previously been proposed by a wood veneer manufacturer to provide a wood veneer product that includes built-in touch sensing capability.

The touch sensing means may rely on electrical conduction through the one or more layers of wood veneer. It is possible that some wood veneers may be electrically conductive, or semiconductive, e.g. depending on moisture content. Alternatively, or in addition, it is possible that the wood veneer is impregnated with conductive particles. For example, it has been proposed that a conductive polymer may be grown in-situ inside the wood fibres of a veneer. Accordingly there may be embodiments wherein the touch sensing means comprises resistive sensing.

The touch sensing means may respond to a user applying pressure through the one or more layers of wood veneer. Accordingly there may be embodiments wherein the touch sensing means comprises piezoelectric sensing.

As compared to capacitive sensing, both resistive and piezoelectric sensing require mechanical deformation of the wood veneer by a user. Accordingly each user input must be applied with a certain pressure, whereas capacitive sensing can respond to light touches across the outer surface of the product.

In yet other embodiments the touch sensing means may possibly comprise surface acoustic wave sensing.

Some general feature of wood veneer will now be described, which may be applied to embodiments according to any of the aspects of the invention outlined above.

It will be appreciated that the one or more layers of wood veneer may comprise any species of natural wood. Where the veneer product includes multiple layers of wood veneer, the layers may be formed from the same kind of wood or different kinds of wood. Each layer of wood veneer may have any suitable thickness. In various preferred embodiments the wood veneer may have a thickness between 0.1 and 3 mm, preferably between 0.1 and 1 mm, and further preferably between 0.2 and 1 mm. In various embodiments the wood veneer may have a thickness of about 0.5 mm. In other words, veneer products according to many embodiments of the present invention may be made from standard wood veneers that are already commercially available, such as those available from Merenda Ltd., Manorhamilton, Co. Leitrim, Ireland.

In some embodiments the one or more layers of wood veneer may comprise one or more types of non-natural wood. In such embodiments the backing layer may be phenolic-based rather than cellulose-based.

As is mentioned above, in at least some embodiments the wood veneer may be mechanically thinned (e.g. by sanding) during manufacture of the wood veneer product. Thus in some embodiments the wood veneer may have a thickness of 0.5 mm or less, 0.4 mm or less, 0.3 mm or less, or about 0.2 mm.

In at least some embodiments, multiple layers of wood veneer can be laminated together to form a wood veneer product up to 3 mm thick e.g. when manufactured in a roll form. The final wood veneer product may be made even thicker, for example in a flat press forming process, by adding further layers (e.g. each 0.5 mm thick) to form a wood veneer product that is 10 mm thick or more. Beyond this point of thickness, using present manufacturing processes, it is not practical or commercial to make wood veneer products.

The one or more layers of wood veneer, and indeed the final wood veneer product, may be supplied in sheets up to 3.5×2 m in size. Typically sheets of wood veneer come in a standard size of about 1.22×2.44 m. In other examples, the one or more layers of wood veneer, and the final wood veneer product, may be supplied in strips up to 280 mm wide, typically 22 mm wide for edging, and of any length. Both sheet and strip wood veneer products may optionally be supplied as a roll.

In various embodiments the sheet or strip of wood veneer product may be intended to be cut into smaller pieces each providing for independent touch sensing. In such embodiments the electrically conductive tracking may be arranged in discrete strips or regions of a given size e.g. for ease of cutting up the veneer product at a later stage. It will be appreciated that the electrically conductive tracking may be localised to a small area of a given wood veneer product, for example to provide a limited touch-sensitive region to be mounted to a piece of furniture while the rest of the receiving surface is covered with passive veneer.

It will be appreciated that what is normally meant by wood veneer is a thin slice of real natural wood. Some common species that may be used to form wood veneer include white oak, European oak, birch, ash, American walnut, pine, white beech, steamed beech, red oak, maple, teak, anigre, cherry, sycamore, sapele and mahogany. This is not an exclusive list. Such natural wood veneers may be dyed. A wood veneer may also comprise reconstituted or man-made wood materials, e.g. non-natural wood.

In various embodiments the wood veneer (or at least the uppermost layer of wood veneer) may be provided with a surface pattern that indicates touch-sensitive regions for user input. Such a surface pattern may include, for example, regions represented as a button, dial, slider, or other user input device. In some examples, the surface pattern may be formed by laser etching. Alternatively, or additionally, in some examples the surface pattern may be formed by marquetry or an arrangement of multiple veneer pieces (laid side-by-side or inlaid). For example, different pieces of wood veneer may be arranged in a layer to provide a patterned surface. Such a surface pattern may be provided on its own or in combination with illumination from underlying light emitters and/or haptic feedback, as described above, to assist a user in identifying locations to touch and the direction of any input gestures.

As is conventional, the wood veneer (or at least the uppermost layer of wood veneer) may have a coating or finish applied. For example, any of a lacquer, oil, wax, resin, varnish or sealant may be applied to the outer surface of the wood veneer without affecting the touch sensing capability of the product.

While various embodiments of the invention discussed above refer to a cellulose-based backing layer bonded to the one or more layers of wood veneer, as is desirable for current mass manufacturing techniques, it will be appreciated that it is not essential for the backing layer to be cellulose-based. Any other suitable material may be used for the backing layer instead. For example, a backing layer material may be chosen to provide a more secure membrane to prevent the possibility of short circuiting once the wood veneer product is bonded by a customer onto another potentially conductive surface.

Some possible embodiments of the present invention will now be described, by way of example only, and with reference to the accompanying drawings, in which.

Figure 1:
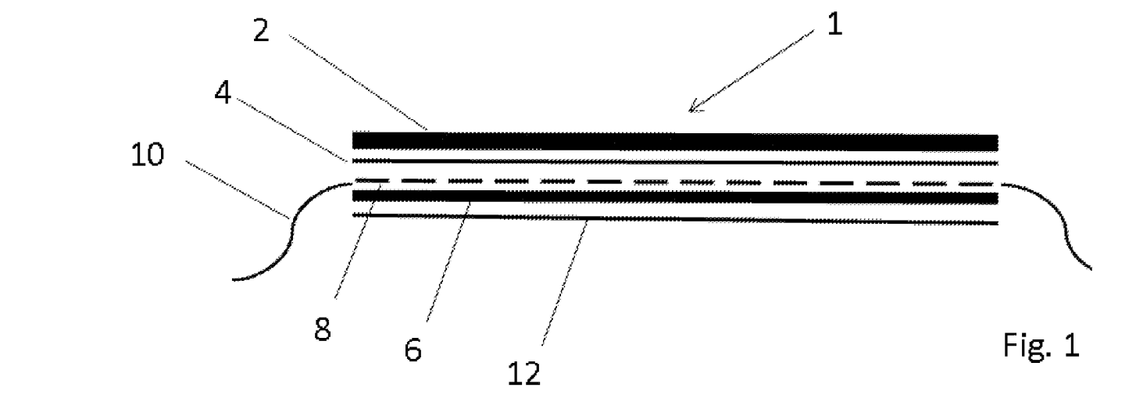
FIG. 1 provides a schematic cross-sectional view of a wood veneer product according to a first embodiment.

There is seen in FIG. 1 a schematic cross-sectional view of a wood veneer product 1 that has built-in touch sensing capability. In this embodiment the wood veneer product 1 has an upper surface provided by a layer of wood veneer 2, for example a 0.5 mm thick veneer of natural wood. Bonded to a lower surface of the wood veneer 2 is a cellulose-based backing layer 4, for example a 0.1 mm thick layer of nonwoven backing fleece. Of course other materials may be used for the backing layer 4, such as a phenolic backing. These layers 2, 4 may be provided as a pre-formed wood veneer before further manufacturing steps add a touch sensing capability. Below the cellulose-based backing layer 4 there is provided a printed circuit board (PCB) 6, for example a flexible PCB comprising a plastic substrate. The PCB 6 carries electrically conductive tracks 8 on one or both of its surfaces, for example silver tracks. The electrically conductive tracks 8 may form a grid for mutual capacitance sensing. Electrical connections 10 are led out from the conductive tracks 8 so that power can be provided and capacitive sensing signals can be processed. Below the PCB 6 there is bonded a final backing layer 12 of insulative material, such as nonwoven backing fleece or plastic film or fibre-reinforced polymer film.

Although not shown in the sectional view of FIG. 1, it will be appreciated that the PCB 6 may have a larger surface area than the overlying layers 2, 4. The backing layer 12 may have the same surface area as the PCB 6 or a different surface area. This means that the PCB 6 may extend beyond the layers 2, 4 to carry the electrical connections 10 to accessible points for connection to external electronics and/or to carry additional circuitry. The PCB 6 may therefore provide ready access when installing the wood veneer product 1 in or on an electrical device or a piece of furniture.

The wood veneer product 1 is fully integrated with all of the layers 2, 4, 6, 12 bonded together, for example by adhesive (not shown) between the layers. This product 1 can then be supplied to a manufacturer of furniture or electrical equipment ready to be applied to a receiving surface. Of course the product 1 may be cut into pieces of a desired size before being applied. Once the product 1 is in situ as a wood veneer, the electrical connections 10 can be connected to a suitable circuit, e.g. including an external microprocessor, for detecting changes in mutual capacitance (or self-capacitance) when a user touches the upper surface of the wood veneer 2. To assist a user in identifying where to touch the surface of the product 1, the wood veneer 2 may be thinned in certain places (e.g. down to 0.2 mm). For example, a thinned region of the wood veneer 2 may take the shape of a button, dial or slider when viewed from above.

Figure 2:
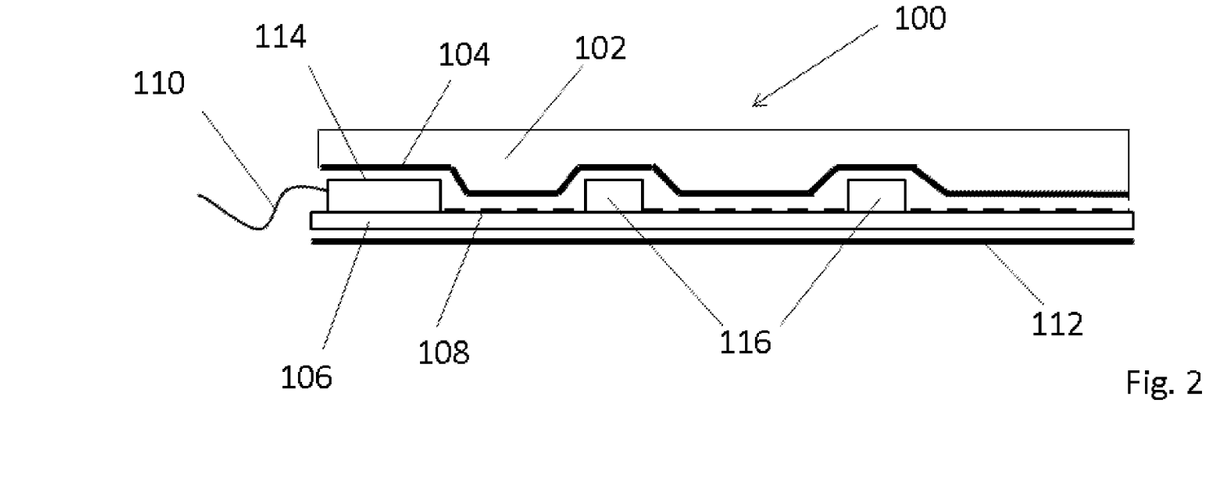
FIG. 2 provides a schematic cross-sectional view of a wood veneer product according to a second embodiment.

There is seen in FIG. 2 a schematic cross-sectional view of another wood veneer product 100 that has built-in touch sensing capability. In this embodiment the upper surface of the product 100 is formed by a layer of wood veneer 102 that has a fleece or phenolic backing 104 pre-bonded to its lower surface. Below this there is arranged a printed circuit board (PCB) 106 which carries electrically conductive tracks 108, a microprocessor 114 and light emitters 116, for example LEDs. It can be seen that the veneer 102 has been thinned in certain regions so as to help accommodate the electrical components 114, 116 mounted on the PCB 106. For example, the veneer 102 may be about 0.5 mm thick but thinned to about 0.2 mm in regions that overly the electrical components 114, 116. The thinned regions above the light emitters 116 can also help to ensure good optical transmission. The light emitters 116 may be used to illuminate areas of the veneer 102 so as to indicate where a user should touch and/or to indicate a successful touch and/or just to share information with the user for display purposes, such as a recognised touch. A backing layer 112 is bonded to the lower surface of the PCB 106 so as to provide an interface for attaching the product 100 to a receiving substrate.

The microprocessor 114 is connected to the electrically conductive tracks 108 and to an input/output cable 110. The microprocessor 114 may therefore control the voltage that is applied to the tracks 108 for capacitive sensing and also receive capacitive sensing signals when a user touches the surface of the veneer 102. The input/output cable 110 enables the microprocessor 114 to be connected to another circuit when the product 100 is applied to a piece of furniture or electrical device, for example to control a light or stereo system.

Figure 3:
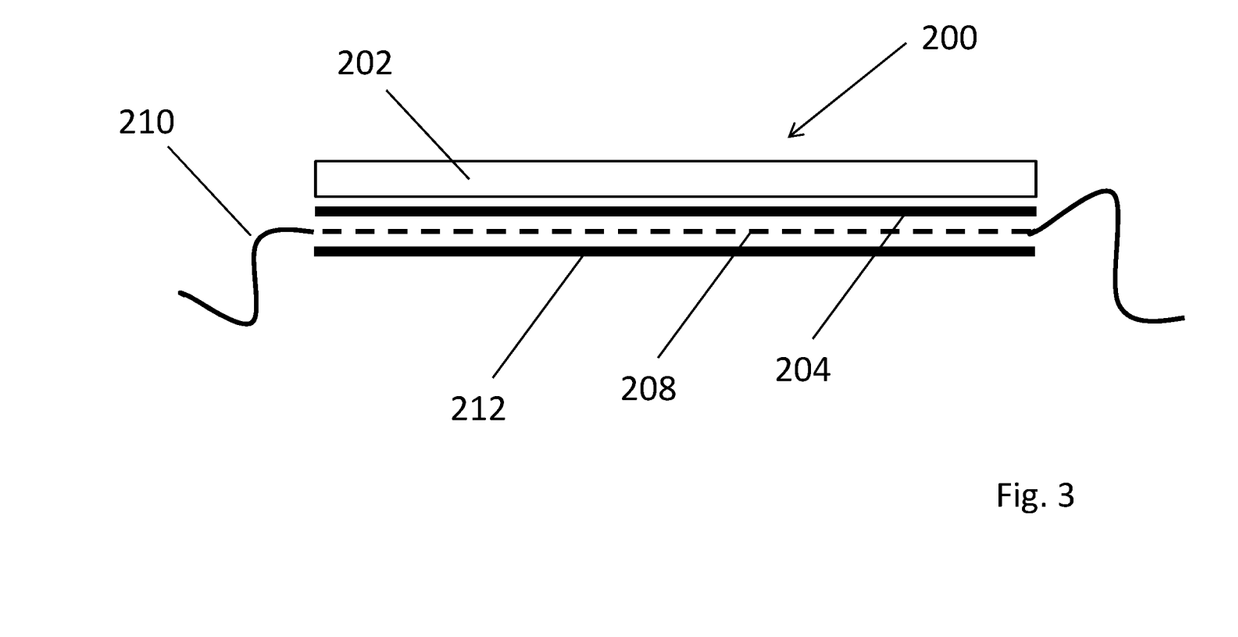
FIG. 3 provides a schematic cross-sectional view of a wood veneer product according to a third embodiment.

There is seen in FIG. 3 a schematic cross-sectional view of another wood veneer product 200 that has built-in touch sensing capability. In this embodiment the upper surface of the product 200 is again formed by a layer of wood veneer 202 that has a cellulose-based (e.g. fleece nonwoven) backing 204 bonded to its lower surface. A further backing layer 212, which may also be cellulose-based, forms a lower surface of the product 200. Electrically conductive tracks 208 (e.g. silver tracks) are placed between the two backing layers 204, 212. The conductive tracks 208 may have been deposited or printed on either of the layers 204, 212. For capacitive sensing, the conductive tracks 208 may be formed in a grid. Electrical connections 210 provide for external power to the conductive tracks 208 and data export. In the illustrated embodiment, the thickness of the product 200 is kept to a minimum by avoiding any further electronics between the layers. However, it will be appreciated that one or more electrical components, such as those discussed above, may also be incorporated between the backing layers 204, 212. The product 200 is fully integrated by the layers 202, 204, 212 being bonded together, e.g. using bonding techniques that are conventional for wood veneer manufacture.

The invention claimed is:

1. A thin and flexible wood veneer product comprising:
    one or more layers of wood veneer;
    a backing layer having a first outer surface bonded to the one or more layers of wood veneer wherein the backing layer has a thickness in a range of 0.05-0.2 mm; and
    electrically conductive tracking arranged on or against a second outer surface of the backing layer opposite to the first outer surface.

2. A wood veneer product according to claim 1, wherein the electrically conductive tracking is arranged to provide capacitive touch sensing.

3. A wood veneer product according to claim 1, wherein the one or more layers of wood veneer comprise one or more recesses arranged to accommodate the electrically conductive tracking.

4. A wood veneer product according to claim 1, wherein the electrically conductive tracking comprises one or more electrically conductive tracks on a flexible printed circuit board.

5. A wood veneer product according to claim 4, wherein the flexible printed circuit board comprises a flexible plastic substrate.

6. A wood veneer product according to claim 4, further comprising one or more electrical components carried on the flexible printed circuit board, wherein the one or more electrical components are selected from the group consisting of: a microprocessor; a piezoelectric actuator; a light emitter; and a wireless transceiver.

7. A wood veneer product according to claim 4, wherein the flexible printed circuit board has a larger surface area than each of (i) the one or more layers of wood veneer and (ii) the backing layer.

8. A wood veneer product according to claim 1, wherein the electrically conductive tracking comprises conductive ink printed on at least one of (i) the second outer surface of the backing layer or (ii) a surface of a further backing layer facing the second outer surface of the backing layer.

9. A wood veneer product according to claim 1, wherein the backing layer is a cellulose-based backing layer.

10. A wood veneer product according to claim 9, wherein the cellulose-based backing layer consists of a nonwoven layer of fibers.

11. A wood veneer product according to claim 1, comprising a further backing layer facing the second outer surface of the backing layer such that the electrically conductive tracking is positioned between the further backing layer and the second outer surface of the backing layer.

12. A wood veneer product according to claim 11, wherein the further backing layer forms an outer surface of the wood veneer product.

13. A wood veneer product according to claim 1, wherein the one or more layers of wood veneer has a thickness between 0.1 and 3 mm.

14. A method of manufacturing a thin and flexible wood veneer product with touch sensing capability, comprising:
    bonding one or more layers of wood veneer to a first surface of a backing layer;
    arranging electrically conductive tracking on or against a second outer surface of the backing layer opposite to the first surface; and
    attaching a further backing layer below the electrically conductive tracking to form a thin and flexible wood veneer product with touch sensing capability.

15. A method according to claim 14, wherein the backing layer is a cellulose-based backing layer.

16. A method according to claim 14, further comprising:
    after the bonding step mechanically thinning at least one of the following items (i) or (ii)
    (i) the one or more layers of wood veneer or (ii) the backing layer, either before or after the arranging of electrically conductive tracking on or against the second outer surface of the backing layer.

17. A method according to claim 14, further comprising:
    selectively thinning one or more regions of the one or more layers of wood veneer.

18. A method according to claim 14, wherein the arranging of electrically conductive tracking comprises:
    mounting a flexible printed circuit board carrying the electrically conductive tracking to or against the second outer surface of the backing layer.

19. A method according to claim 14, further comprising:
    printing electrically conductive ink on at least one of (i) the second outer surface of the backing layer or (ii) a surface of the further backing layer facing the second outer surface of the backing layer.

* * * * *